(12) United States Patent
Lin et al.

(10) Patent No.: US 9,368,396 B1
(45) Date of Patent: Jun. 14, 2016

(54) GAP FILL TREATMENT FOR VIA PROCESS

(71) Applicant: Powerchip Technology Corporation, Hsinchu (TW)

(72) Inventors: Hsiao-Chiang Lin, New Taipei (TW); Kuan-Heng Lin, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/691,591

(22) Filed: Apr. 21, 2015

(30) Foreign Application Priority Data

Jan. 12, 2015 (TW) ............... 104100957 A

(51) Int. Cl.
*H01L 21/768* (2006.01)
*H01L 21/311* (2006.01)

(52) U.S. Cl.
CPC .... *H01L 21/76808* (2013.01); *H01L 21/31144* (2013.01)

(58) Field of Classification Search
CPC . H01L 21/00; H01L 21/0273; H01L 21/0337; H01L 21/76; H01L 21/76224; H01L 21/76898
See application file for complete search history.

(56) References Cited

U.S. PATENT DOCUMENTS

| | | | |
|---|---|---|---|
| 6,482,716 B1 * | 11/2002 | Wohlfahrt | H01L 21/76229 257/E21.548 |
| 2008/0020327 A1 | 1/2008 | Yang et al. | |
| 2014/0070292 A1 | 3/2014 | Cheng et al. | |

FOREIGN PATENT DOCUMENTS

| | | |
|---|---|---|
| TW | 535215 | 6/2003 |
| TW | 200306645 | 11/2003 |
| TW | 200928592 | 7/2009 |

OTHER PUBLICATIONS

Huang et al., "Advanced developer-soluble gap-fill materials and applications," Proc. of SPIE 6519 Advances in Resist Materials and Processing Technology XXIV, Apr. 2, 2007, pp. 65192T-1-65192T-8.
"Office Action of Taiwan Counterpart Application", issued on Mar. 14, 2016, p1-p6, in which the listed references were cited.

* cited by examiner

*Primary Examiner* — Kyoung Lee
(74) *Attorney, Agent, or Firm* — Jianq Chyun IP Office

(57) ABSTRACT

A gap fill treatment for via process is provided. A substrate with a plurality of openings has formed therein is provided. The substrate includes a dense pattern region and an isolated pattern region. A positive resist layer is formed to fill in the openings on the substrate, wherein the thickness of the positive resist layer on the surface of the isolated pattern region is greater than that on the surface of the dense pattern region. The positive resist layer on the surface of the substrate is exposed only. The exposed positive resist layer is developed to form a gap-filling material layer, wherein the gap-filling material layer has the same thickness in the dense pattern region and in the isolated pattern region. A reagent is coated on the surface to form a reaction layer. The reaction layer is removed so that a cap layer remained on the gap-filling material layer.

13 Claims, 4 Drawing Sheets

GAP FILL TREATMENT FOR VIA PROCESS

CROSS-REFERENCE TO RELATED APPLICATION

This application claims the priority benefit of Taiwan application serial no. 104100957, filed on Jan. 12, 2015. The entirety of the above-mentioned patent application is hereby incorporated by reference herein and made a part of this specification.

BACKGROUND OF THE INVENTION

1. Field of the Invention

The present invention relates to a manufacturing method of semiconductor devices, and especially relates to a gap fill treatment for via process.

2. Description of Related Art

In today's booming development of integrated circuits, scaling down and integration of the device are inevitable trend and also are important problems on which the industry is actively working. In the entire semiconductor manufacturing process, the key which affects the size of the device is the technology of the photolithography process. Also, along with high integration of the semiconductor device, the critical dimension (CD) of the integrated circuit is getting smaller, and thus the resolution required for the photolithography process is getting higher.

During the semiconductor manufacturing process, it is often required to perform gap fill treatment to various openings. Various deposition methods to fill various materials and form a gap-filling material layer are used for the openings which are formed during the semiconductor manufacturing process. For example: an insulation material is filled in trenches of the Shallow Trench Isolation (STI) structure; a conductive layer is filled in contact holes of the Inter-Layer Dielectric (ILD) structure; a conductive layer is filled in via openings of the Inter-Metal Dielectric (IMD) structure; or a conductive layer is filled in dual damascene openings of the metal interconnect structure.

However, during the gap fill treatment, if the difference in the pattern density between the dense pattern region and the isolated pattern region is great, it may cause difference in thickness of the photoresist layer between these regions and thus cause the step height. The difference in the step height may cause the gap-filling material layer to have difference in thickness and an uneven surface, which causes de-focus in the subsequent exposure process and causes etching to be uneven, thereby affect the resolution of the photolithography process.

Therefore, well known gap fill treatment methods may use the etching back method for flattening the surface so as to allow a bottom anti-reflective layer or other material layers which are subsequently formed on the surface of the substrate and the openings to preserve favorable flatness. However, the etching back methods cannot treat the difference in thickness (i.e. the difference in step height) of the gap-filling material layer of each opening resulted from the pattern densities. The etching back methods also have a problem that the gap-filling material layer may be easily eroded by the solvent used in the subsequent process so that the difference in thickness of the gap-filling material layer filled in the openings and unevenness of the pattern surface cannot be solved.

SUMMARY OF THE INVENTION

The present invention provides a gap fill treatment for via process used for eliminating the difference in step height, which is the difference in thickness of the gap-filling material layer filled in the openings resulted from the different pattern densities, to avoid de-focus caused by the difference in thickness of the gap-filling material layer filled in the openings. In addition, the gap fill treatment for via process of the present invention can be used for protecting the gap-filling material layer so as to prevent the gap-filling material layer from being eroded by the solvent in the subsequent process.

A gap fill treatment for via process is provided. A substrate to which a plurality of openings has been formed is provided. The substrate includes a dense pattern region and an isolated pattern region, and the pattern density of the openings in the dense pattern region is higher than the pattern density of the openings in the isolated pattern region. A positive resist layer is formed on the substrate with which the openings are filled in, wherein the thickness of the positive resist layer on the surface of the isolated pattern region is greater than the thickness of the positive resist layer on the surface of the dense pattern region. The positive resist layer on the surface of the substrate is exposed only. The exposed positive resist layer is developed to form a gap-filling material layer inside the plurality of openings, wherein the thickness of the gap-filling material layer is the same on both the dense pattern region and the isolated pattern region. A reagent is applied on the surface of the gap-filling material layer and the substrate so as to form a reaction layer, wherein a cap layer is formed between the gap-filling material layer and the reaction layer. The reaction layer is removed by using a solvent so that the cap layer remains on the gap-filling material layer.

In an embodiment of the gap fill treatment for via process of the present invention, the plurality of openings is formed by photolithography and etching.

In an embodiment of the gap fill treatment for via process of the present invention, the plurality of openings includes via openings, contact windows, trenches and dual damascenes or any combination thereof.

In an embodiment of the gap fill treatment for via process of the present invention, the method for forming the positive resist layer includes a spin coating method.

In an embodiment of the gap fill treatment for via process of the present invention, a positive resist which is used for the positive resist layer includes phenol formaldehyde derivative, methacrylate, acrylate, polyhydroxystyrene or any combination thereof.

In an embodiment of the gap fill treatment for via process of the present invention, the wavelength of light used for the exposure is 248 nm.

In an embodiment of the gap fill treatment for via process of the present invention, the developing is performed by using a developer.

In an embodiment of the gap fill treatment for via process of the present invention, the developer includes tetramethylammonium hydroxide.

In an embodiment of the gap fill treatment for via process of the present invention, the reagent includes a water-soluble resin and a crosslinking agent.

In an embodiment of the gap fill treatment for via process of the present invention, the solvent is deionized water.

In an embodiment of the gap fill treatment for via process of the present invention, after removing the reaction layer, a bottom anti-reflective layer or a photoresist layer is further formed on the substrate and the cap layer.

In an embodiment of the gap fill treatment for via process of the present invention, the material of the bottom anti-reflective layer includes an inorganic material such as titanium, titanium dioxide, titanium nitride, chromium oxide, carbon and α-silicon, or an organic material comprising a photoabsorber and a polymer or any combination thereof.

In an embodiment of the gap fill treatment for via process of the present invention, a planar layer can be formed on the bottom anti-reflective layer or the photoresist layer.

Based on the above, according to the gap fill treatment for via process of the present invention, since only the positive resist layer on the surface of the substrate is exposed in the subsequent exposure process after filling the positive resist layer in the openings by adjusting exposure parameters, only a small portion of light exposes the positive resist layer filled in the plurality of openings. Accordingly, only the positive resist layer on the surface of the substrate is removed after the developing. Thereby, in the gap fill treatment, the difference in step height, which is the difference in thickness of the gap-filling material layer filled in the openings resulted from the different pattern densities, is eliminated, and de-focus caused by the difference in thickness of the gap-filling material layer filled in the openings is prevented. Also, by adjusting exposure parameters according to the requirement, the thickness of the gap-filling material layer filled in the openings can be controlled. In addition, the gap fill treatment for via process of the present invention can be used to protect the gap-filling material layer so as to prevent the gap-filling material layer from being eroded by the solvent in the subsequent process.

An embodiment is hereinafter described in detail based on the drawings for clear understanding of the above-mentioned features and advantages of the present invention.

DESCRIPTION OF THE EMBODIMENT

Figure 1A:
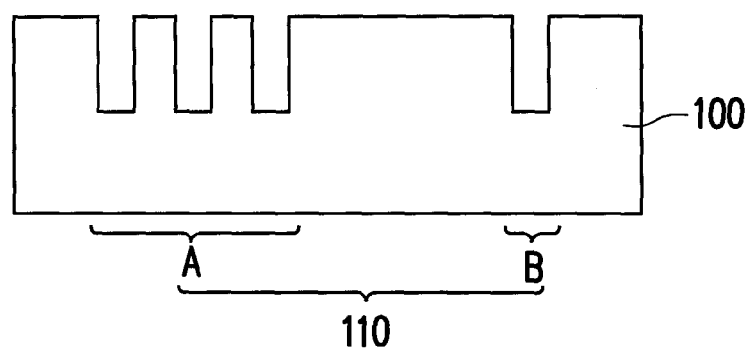
FIGS. 1A to 1I are sectional views of the process according to an embodiment of the gap fill treatment for via process of the present invention.

An embodiment of the present invention is hereinafter described in detail based on the drawings, but the present invention is not limited thereto. Various different embodiments are applicable to the present invention. The terms indicating directions in the following embodiment, such as "above", are intended only to be with respect to the paper surface of the attached drawings. Thus, these terms indicating directions are used for detailed description and not for limiting the present invention. Also, in the drawings, the size and relative size of each layer are emphatically depicted for clear understanding.

An embodiment of the gap fill treatment for via process of the present invention is described hereinafter.

Firstly, referring to FIG. 1A, a substrate 100 is provided. The substrate 100 is, for example, a silicon substrate or a semiconductor structure which is covered by a dielectric layer, a semiconductor material layer or a conductive layer. A plurality of openings 110 are formed on the substrate 100, and the plurality of openings is, for example, via openings, contact holes, trenches, dual damascenes or any combination thereof. The plurality of openings is formed by photolithography and etching.

The substrate 100 includes a dense pattern region A and an isolated pattern region B based on pattern densities of the openings thereof, and the pattern density of the openings of the dense pattern region A is higher than the pattern density of the openings of the isolated pattern region B (here, the pattern density refers to the number of openings in each unit area). The dense pattern region A indicates that there exist two or more openings, wherein the spacing between these openings is substantially narrow. The isolated pattern region B is, for example, the region includes only a single opening, or the region in which the spacing of the openings is substantially wide. The dense pattern region A is, for example, the region used for forming memory cells. The isolated pattern region B is, for example, the region where the word line inside the memory structure is connected to the external voltage.

Figure 1B:
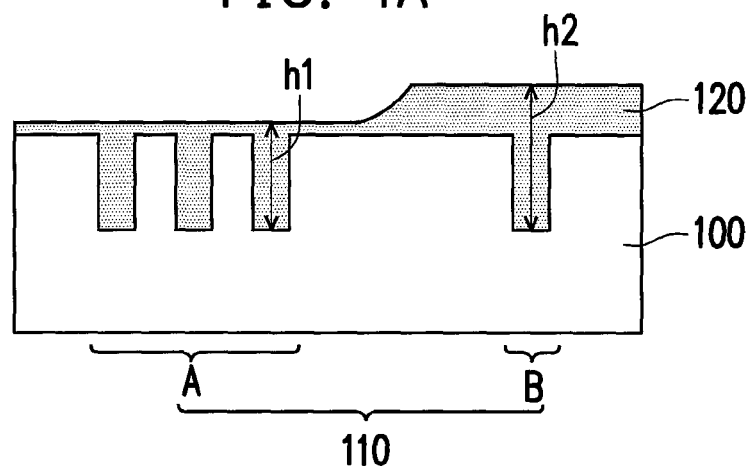

Next, referring to FIG. 1B, a positive resist layer 120 is formed on the substrate 100 by a spin coating so as to fill in the openings 110. The difference in density between the dense pattern region A and the isolated pattern region B is significantly great so that it causes the thickness of the positive resist layer 120 to be uneven on the dense pattern region A and on the isolated pattern region B and results as the step height. The thickness h2 of the positive resist layer 120 on the surface of the isolated pattern region B is greater than the thickness h1 of the positive resist layer 120 on the surface of the dense pattern region A, and the step height is calculated by subtracting h1 from h2. The material of the positive resist layer 120 is, for example, a positive resist which includes phenol formaldehyde derivative, methacrylate, acrylate, polyhydroxystyrene or any combination thereof.

In this embodiment, the material of the positive resist layer 120 is, for example, a commercial photoresist [KrF resist GKR5315D7 (480 nm) produced by FUJIFILM Electronic Materials or ArF resist AR2772 produced by JSR Corporation].

Figure 1C:
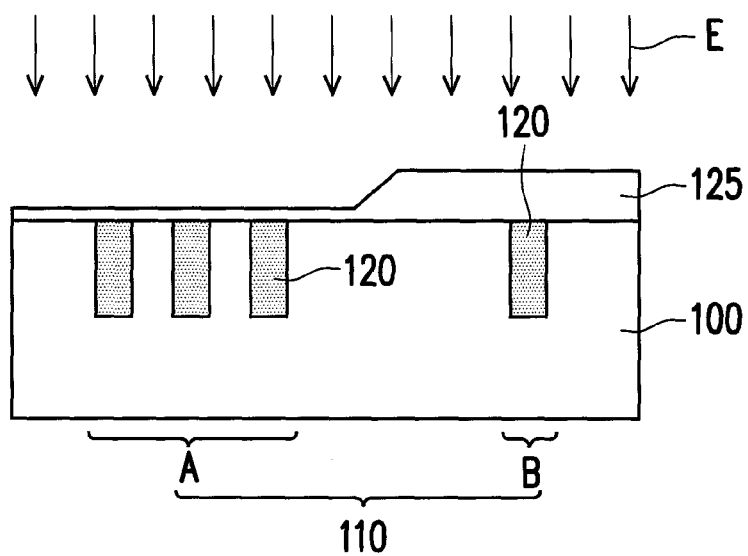

Next, referring to FIG. 1C, an exposure process E is performed only to the positive resist layer 120 on the surface of the substrate 100, and an exposed positive resist layer 125 is obtained. In this embodiment, the exposure is performed only to the surface of the substrate, and only a small portion of light exposes the positive resist layer 120 filled in the plurality of openings 110. Exposure parameters can be adjusted according to the requirement to control the exposure depth to the positive resist layer 120 filled in the openings 110 under different pattern densities. In this embodiment, the wave length of the light is 248 nm.

Figure 1D:
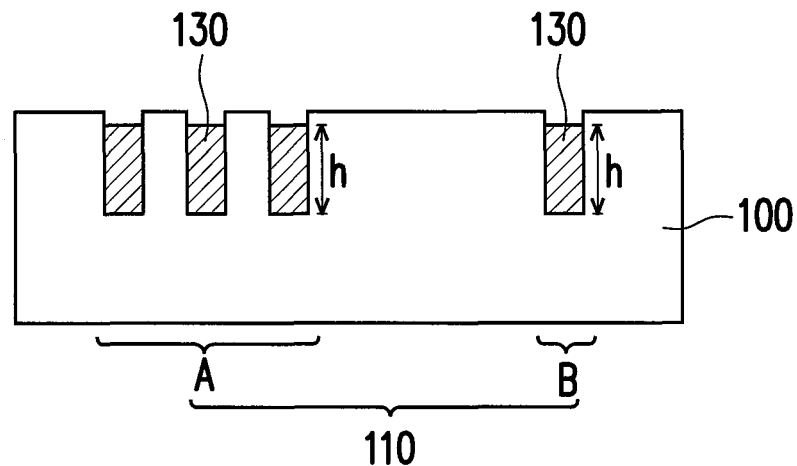

Next, referring to FIG. 1D, a development process is performed, and the exposed positive resist layer 125 is removed. A gap-filling material layer 130 is formed in the plurality of openings 110. The gap-filling material layer 130 has the same thickness h in the dense pattern region A and in the isolated pattern region B, and there is no step height. It is also possible to create the gap-filling material layer 130 with the step height having different thickness in the dense pattern region A and in the isolated pattern region B by adjusting exposure parameters. In this embodiment, the development is performed by using a developer. The developer includes, for example, tetramethylammonium hydroxide.

In the above embodiment, since only the positive resist layer on the surface of the substrate is exposed by adjusting exposure parameters during the subsequent exposure process after the positive resist is filled in the openings, only a small portion of light exposes the positive resist layer filled in the plurality of openings. Thus, in the development process, only the positive resist on the surface of the substrate is removed. Thereby, the step height, which is the difference in thickness of the gap-filling material layer filled in the openings resulted from the different pattern densities, in the gap fill treatment is eliminated, and the defocus caused by the difference in thickness of the gap-filling material layer is avoided. It is also possible to control the difference in thickness of the gap-filling material layer filled in the openings resulted from the different pattern densities according to the requirement.

Figure 1E:
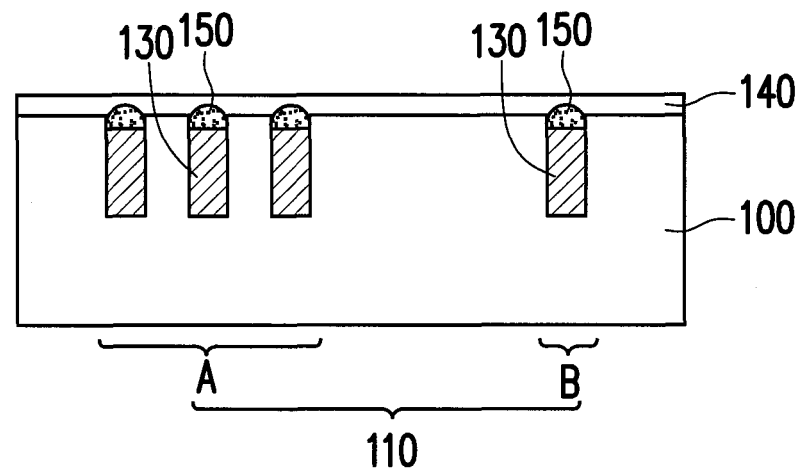

After completing the processes in FIGS. 1A to 1D, the gap-filling material layer 130 formed inside the plurality of openings 110 is obtained. The gap-filling material layer 130 has the same thickness h in the dense pattern region A and in the isolated pattern region B. Next, referring to FIG. 1E, a reagent is applied to the gap-filling material layer 130 and the surface of the substrate 110 to form a reaction layer 140. A cap layer 150 is formed between the gap-filling material layer 130 and the reaction layer 140.

The material of the reagent includes, for example, water soluble resin and crosslinker. In this embodiment, the reaction layer 140 is formed by the Resolution Enhance Lithography Assisted by Chemical Shrink (RELACS) process. The material of the reagent is, for example, a commercial RELACS reagent (AZR200T, produced by AZ Electronic Materials). The method of forming the reaction layer 140 is, for example, a spin coating method.

The cap layer 150 is, for example, a water-insoluble material layer created by chemical reaction of a water-soluble resin, a crosslinker and a photoresist, and is used for protecting the gap-filling material layer 130 so as to prevent the gap-filling material layer from being eroded by a solvent during the subsequent processes.

Figure 1F:
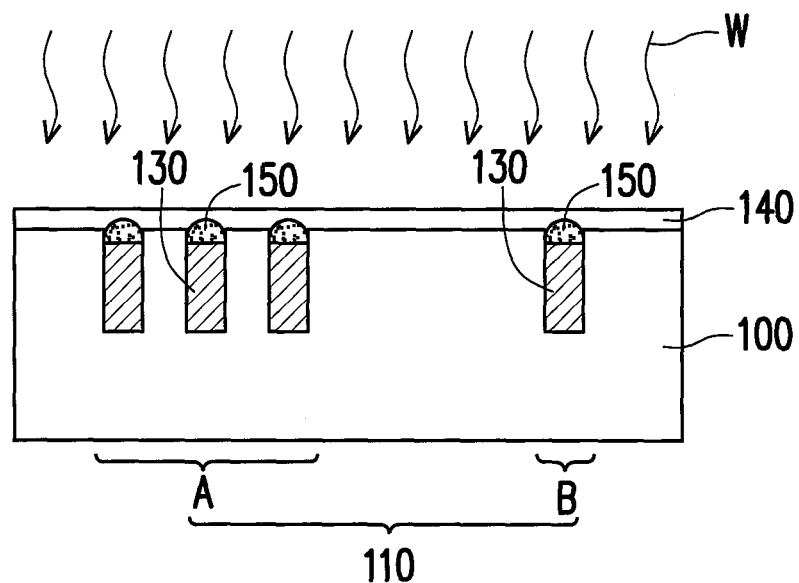
Figure 1G:
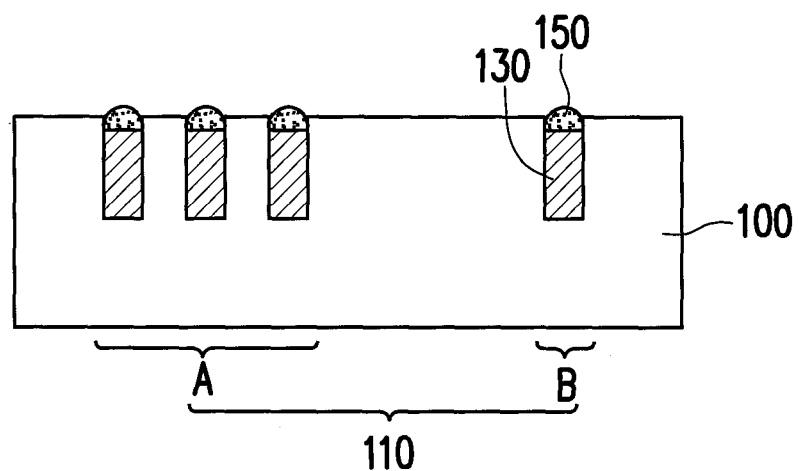

Then, referring to FIGS. 1F to 1G, a solvent treatment W is performed by using a solvent, and the reaction layer 140 is removed. The cap layer 150 is remained on the gap-filling material layer 130. The solvent needs to be able to dissolve only the reaction layer 140 without affecting the cap layer 150, and has no specific limitation. In view of the cost, the solvent is preferably deionized water. In this embodiment, the position of the surface of the cap layer 150 is higher than the position of the surface of the substrate 100. Then, the position of the surface of the cap layer 150 with respect to the position of the surface of the substrate 100 can be optionally adjusted according to the requirement, and has no specific limitation.

Figure 1H:
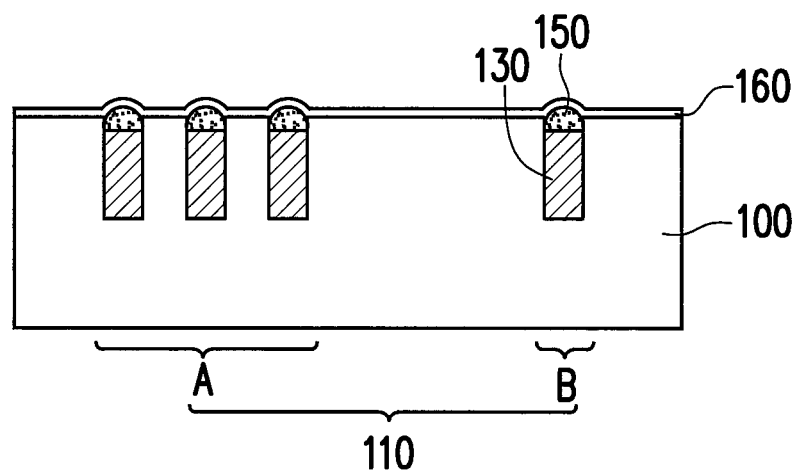

Referring to FIG. 1H, in an embodiment of the present invention, after removing the reaction layer 140, a bottom anti-reflective layer 160 or a photoresist layer is further formed on the substrate 100 and the cap layer 150. It should be noted that even though in this embodiment it is described as an example that the bottom anti-reflective layer 160 is formed on the substrate 100 and the cap layer 150, the present invention is not limited thereto. In other embodiments, different thin films can be formed respectively on the substrate 100 and on the cap layer 150 according to the requirement. The material of the bottom anti-reflective layer 160 includes, for example, an inorganic material such as titanium, titanium dioxide, titanium nitride, chromium oxide, carbon and α-silicon, or an organic material including a photoabsorber and a polymer or any combination thereof. The method of forming the bottom anti-reflective layer 160 is, for example, a spin coating method.

Figure 1I:
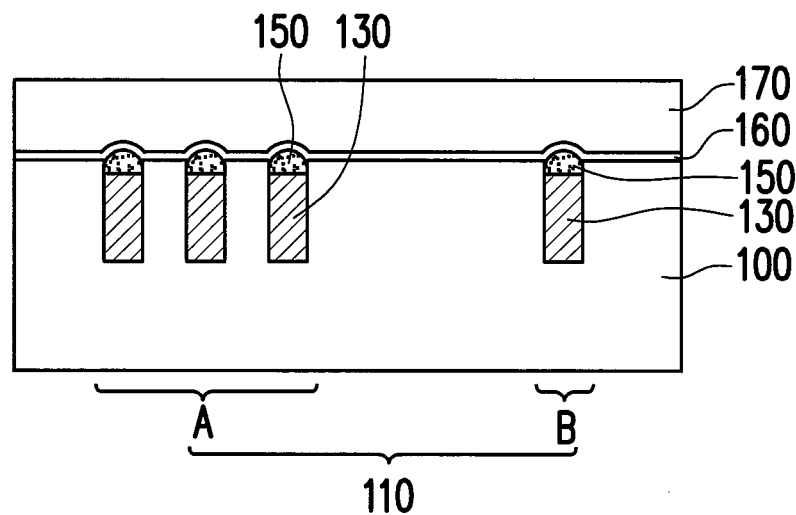

Next, referring to FIG. 1I, in an embodiment of the present invention, a planar layer 170 is formed on the surface of the bottom anti-reflective layer 160. The material of the planar layer 170 is, for example, an organic material or an inorganic material. The material of the planar layer 170 can be selected according to the requirement and has no specific limitation. The method of forming the planar layer 170 is, for example, a spin coating method.

The above-mentioned methods of the present invention can be widely used in various manufacturing processes, and are simple compared to known methods. Concrete examples to which the present invention can be applied include a production process of deep trench capacitor and a dual damascene process, etc.

To summarize, in the gap fill treatment for via process provided by the present invention, since only the positive resist layer on the surface of the substrate is exposed by adjusting exposure parameters during the subsequent exposure process after the positive resist is filled in the openings, only a small portion of light exposes the positive resist layer filled in the plurality of openings. Thus, during the development process, only the positive resist layer on the surface of the substrate is removed. Accordingly, during the gap fill treatment, the difference in thickness of the gap-filling material layer filled in the openings, which is resulted from the difference in pattern densities, is eliminated.

Regarding the gap-filling material layer filled in the plurality of openings, it is possible to make the gap-filling material layer filled in the openings of different pattern densities has the same thickness H and a flat surface so that the step height of the gap-filling material layer inside each of the openings under different pattern densities is eliminated. Accordingly, it is possible to reduce de-focus caused by the difference in thickness.

In addition, the position of the surface of the cap layer with respect to the position of the surface of the substrate can be adjusted according to the requirement, so the difference in thickness of the gap-filling material layer filled in the openings resulted from the different pattern densities can be controlled according to the requirement. The position of the surface of the cap layer is, for example, higher than the position of the surface of the substrate, horizontal to the surface of the substrate or lower than the surface of the substrate. In an embodiment of the present invention, the surface of the cap layer is higher than the surface of the substrate.

Although the present invention has been described with reference to the above embodiments, it is not limited thereto. It will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A gap fill treatment for via process, comprising:
    providing a substrate to which a plurality of openings has been formed, wherein the substrate comprises an dense pattern region and an isolated pattern region, and a pattern density of the openings in the dense pattern region is higher than a pattern density of the openings in the isolated pattern region;
    forming a positive resist layer on the substrate with which the openings are filled in, wherein a thickness of the positive resist layer on the surface of the isolated pattern region is greater than a thickness of the positive resist layer on the surface of the dense pattern region;
    exposing only the positive resist layer on the surface of the substrate;
    developing the exposed positive resist layer, and forming a gap-filling material layer inside the plurality of openings, wherein a thickness of the gap-filling material layer is the same on both the dense pattern region and the isolated pattern region;
    applying a reagent on the surface of the gap-filling material layer and the substrate so as to form a reaction layer, wherein a cap layer is formed between the gap-filling material layer and the reaction layer; and
    removing the reaction layer by using a solvent so that the cap layer remains on the gap-filling material layer.

2. The gap fill treatment for via process of claim 1, wherein the plurality of openings is formed by photolithography and etching.

3. The gap fill treatment for via process of claim 1, wherein the plurality of openings comprises via openings, contact windows, trenches and dual damascenes or any combination thereof.

4. The gap fill treatment for via process of claim 1, wherein the step of forming the positive resist layer includes performing a spin coating.

5. The gap fill treatment for via process of claim 1, wherein a positive resist which is used for the positive resist layer comprises phenol formaldehyde derivative, methacrylate, acrylate, polyhydroxystyrene or any combination thereof.

6. The gap fill treatment for via process of claim 1, wherein a wavelength of light used for the exposure is 248 nm.

7. The gap fill treatment for via process of claim 1, wherein the developing is performed by using a developer.

8. The gap fill treatment for via process of claim 7, wherein the developer comprises tetramethylammonium hydroxide.

9. The gap fill treatment for via process of claim 1, wherein the reagent comprises a water-soluble resin and a crosslinking agent.

10. The gap fill treatment for via process of claim 1, wherein the solvent is deionized water.

11. The gap fill treatment for via process of claim 1, further comprising forming a bottom anti-reflective layer or a photoresist layer on the substrate and the cap layer, after the step of removing the reaction layer.

12. The gap fill treatment for via process of claim 11, wherein a material of the bottom anti-reflective layer comprises an inorganic material selected form a group consisting of titanium, titanium dioxide, titanium nitride, chromium oxide, carbon and α-silicon, or an organic material comprising a photoabsorber and a polymer or any combination thereof.

13. The gap fill treatment for via process of claim 11, further comprising forming a planar layer on the bottom anti-reflective layer or the photoresist layer.

* * * * *